(12) United States Patent
Uchida et al.

(10) Patent No.: US 7,214,984 B2
(45) Date of Patent: May 8, 2007

(54) HIGH-BREAKDOWN-VOLTAGE INSULATED GATE SEMICONDUCTOR DEVICE

(75) Inventors: Masao Uchida, Osaka (JP); Makoto Kitabatake, Nara (JP); Osamu Kusumoto, Nara (JP); Kenya Yamashita, Osaka (JP); Kunimasa Takahashi, Osaka (JP); Ryoko Miyanaga, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/553,628

(22) PCT Filed: Nov. 24, 2004

(86) PCT No.: PCT/JP2004/017425

§ 371 (c)(1),
(2), (4) Date: Oct. 19, 2005

(87) PCT Pub. No.: WO2005/053034

PCT Pub. Date: Jun. 9, 2005

(65) Prior Publication Data

US 2006/0220026 A1 Oct. 5, 2006

(30) Foreign Application Priority Data

Nov. 25, 2003 (JP) .............................. 2003-393320

(51) Int. Cl.
*H01L 29/76* (2006.01)
(52) U.S. Cl. ..................... 257/328; 257/77; 257/628
(58) Field of Classification Search .............. 257/77, 257/302, 328, 628
See application file for complete search history.

(56) References Cited

U.S. PATENT DOCUMENTS 5,977,564 A 11/1999 Kobayashi et al.
6,097,039 A 8/2000 Peters et al.

(Continued)

FOREIGN PATENT DOCUMENTS

JP 10-321854 A 12/1998

(Continued)

OTHER PUBLICATIONS

G.Y. Chung, et al., "Improved Invention Channel Mobility for 4H-SiC MOSFETs Following High Temperature Anneals in Nitric Oxide," Electron Device Letters, Apr. 2001, pp. 176-178, vol. 22, No. 4, IEEE.

*Primary Examiner*—Wai-Sing Louie
*Assistant Examiner*—Mursalin B. Hafiz
(74) *Attorney, Agent, or Firm*—McDermott Will & Emery LLP

(57) ABSTRACT

In a semiconductor device of the present invention, the top surface of an n-type silicon carbide layer formed on a silicon carbide substrate is miscut from the (0001) plane in the <11-20> direction. A gate electrode, a source electrode and other elements are arranged such that in a channel region, the dominating current flows along a miscut direction.

In the present invention, a gate insulating film is formed and then heat treatment is performed in an atmosphere containing a group-V element. In this way, the interface state density at the interface between the silicon carbide layer and the gate insulating film is reduced. As a result, the electron mobility becomes higher in a miscut direction A than in the direction perpendicular to the miscut direction A.

17 Claims, 14 Drawing Sheets

U.S. PATENT DOCUMENTS

| | | | |
|---|---|---|---|
| 6,320,215 B1 * | 11/2001 | Bronner et al. | 257/301 |
| 6,566,708 B1 * | 5/2003 | Grover et al. | 257/330 |
| 2003/0080384 A1 | 5/2003 | Takahashi et al. | |
| 2004/0159841 A1 * | 8/2004 | Hisada et al. | 257/77 |
| 2006/0237728 A1 * | 10/2006 | Ryu | 257/77 |

FOREIGN PATENT DOCUMENTS

| | | |
|---|---|---|
| JP | 2000-294777 A | 10/2000 |
| JP | 2001-144288 A | 5/2001 |
| JP | 2001-517375 A | 10/2001 |
| JP | 2002-280381 A | 9/2002 |
| JP | 2003-209251 A | 7/2003 |
| JP | 2003-234301 A | 8/2003 |
| WO | WO 99/48153 | 9/1999 |

* cited by examiner

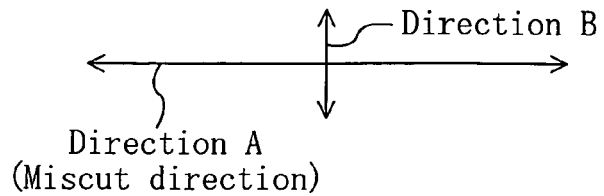
FIG. 8A
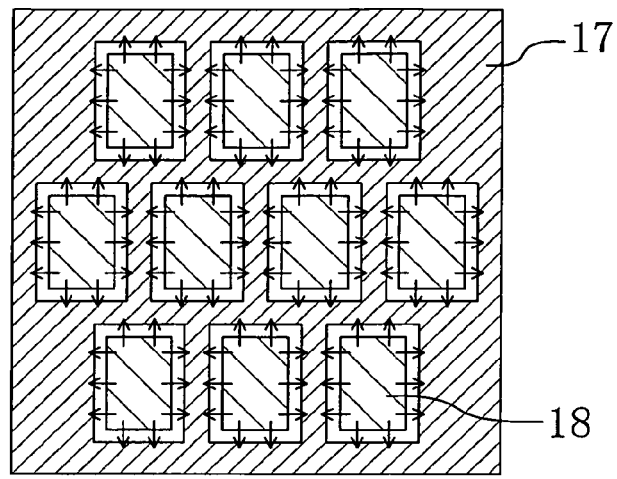
FIG. 8B
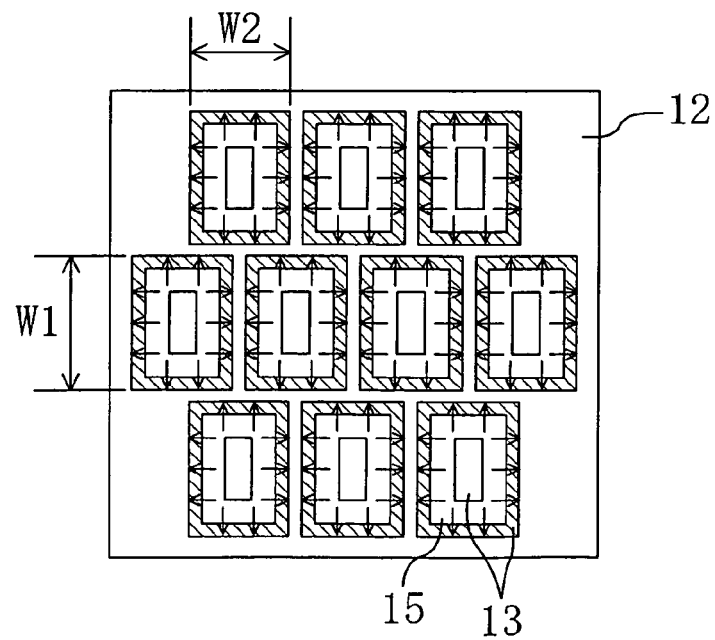

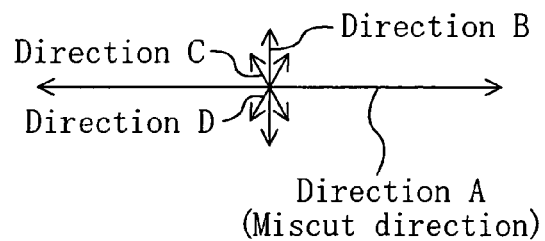
FIG. 9A
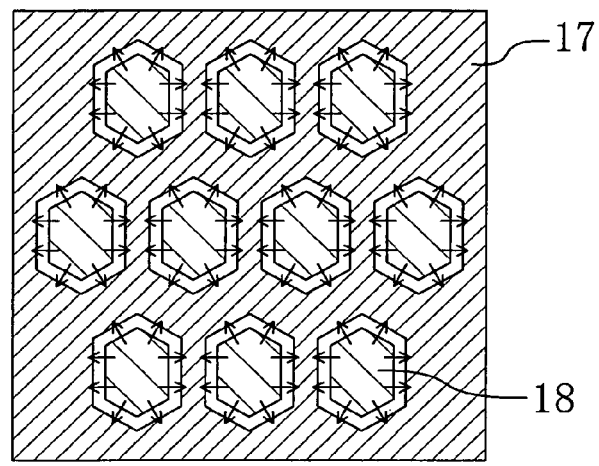
FIG. 9B
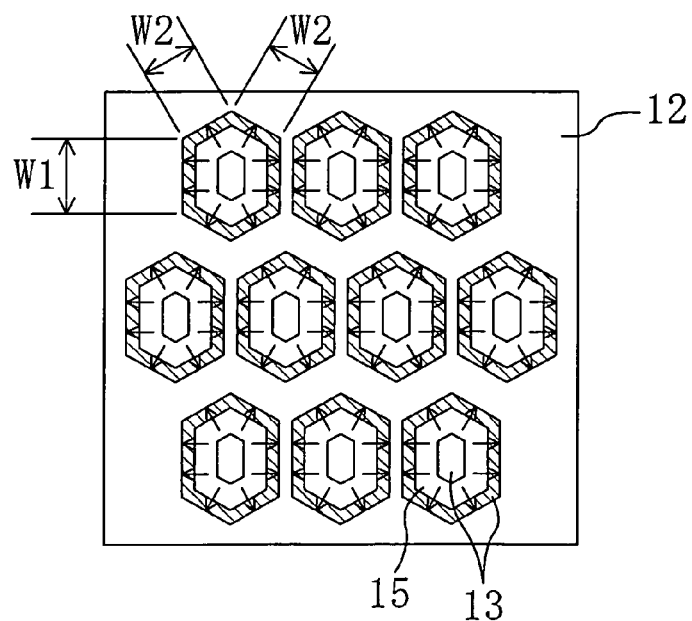

HIGH-BREAKDOWN-VOLTAGE INSULATED GATE SEMICONDUCTOR DEVICE

RELATED APPLICATION

This application is the U.S. National Phase under 35 U.S.C. § 371 of International Application No. PCT/JP2004/017425, filed on Nov. 24, 2004, which in turn claims the benefit of Japanese Application No. 2003-393320, filed on Nov. 25, 2003, the disclosure of which Applications are incorporated by reference herein.

TECHNICAL FIELD

The present invention relates to a high-breakdown-voltage insulated gate semiconductor device using silicon carbide, and more particularly relates to a MOS field effect transistor (MOSFET) that provides a large-current switching device.

BACKGROUND ART

Silicon carbide (SiC) is a semiconductor with a higher hardness and a wider band gap than silicon (Si) and applied to power devices, environmentally resistant devices, high-temperature operating devices, high-frequency devices, and other devices.

For example, MOSFETs as disclosed in Patent Document 1 that will be described below are known as representative switching devices using SiC. FIGS. 14(a) and 14(b) are diagrams showing typical vertical accumulation-mode MOSFETs using SiC. In a unit cell of a typical vertical MOSFET, a source electrode is arranged in the middle of the unit cell. On the other hand, FIGS. 14(a) and 14(b) show the arrangement of electrodes with a gate electrode arranged in the middle. That is, FIGS. 14(a) and 14(b) show a joint between two unit cells. FIG. 14(a) is a plan view showing some of electrodes of MOSFETs when seen from above, and FIG. 14(b) is a cross-sectional view showing the MOSFETs taken along the line XI—XI shown in FIG. 14(a).

As shown in FIGS. 14(a) and 14(b), the known vertical accumulation-mode MOSFET comprises a semiconductor substrate 101 made of $n^+$-type 4H—SiC, an n-type silicon carbide layer 102 formed on the semiconductor substrate 101 and made of n-type 4H—SiC, p-type well regions 103 formed in regions of the upper part of the n-type silicon carbide layer 102 located at both sides of the joint between the two unit cells and doped with, for example, aluminum, a channel layer 104 formed on a region of the n-type silicon carbide layer 102 interposed between the two p-type well regions 103 and the top surfaces of the two p-type well regions and made of, for example, n-type 4H—SiC, source regions 105 formed in the upper parts of the p-type well regions 103 to come into contact with the lateral sides of the channel layer 104, respectively, and doped with, for example, nitrogen, a gate insulating film 106 formed on the channel layer 104 and respective parts of the source regions 105, a gate electrode 107 formed on a part of the gate insulating film 106, source electrodes 108 formed from on the top surface of the source regions 105 to on respective parts of the n-type silicon carbide layer 102 located to the outermost lateral sides of the source regions 105, and a drain electrode 109 formed on the back surface of the semiconductor substrate 101.

The source electrodes 108 each have a structure in which it also functions as base electrodes to which the p-type well regions 103 are electrically connected.

In order to turn the MOSFET ON, a positive voltage is applied to the drain electrode 109, the source electrodes 108 are grounded, and a positive voltage is applied to the gate electrode 107. In this way, switching operations of the MOSFET can be achieved.

When the MOSFET is thus turned ON, electrons serving as carriers initially flow in the direction parallel to a substrate surface as shown in FIGS. 14(a) and 14(b). Thereafter, the electrons flow in the direction perpendicular to the substrate surface as shown in FIG. 14(b). The arrows shown in FIGS. 14(a) and 14(b) show directions in which electrons serving as carriers travel. Current flows in the opposite directions to these arrows. In this relation, the directions in which electrons travel in FIG. 14(a) should be noted. The source electrodes 108 and the gate electrode 107 are arranged such that carriers travel in the direction perpendicular to a substrate miscut direction A. The "miscut direction" indicates the direction within a miscut surface inclined at an angle of several degrees from the crystal plane and extending from a normal vector to the crystal plane toward a normal vector to the miscut surface. The reason why the electrodes are arranged as described above will be described hereinafter with reference to FIG. 15. FIG. 15 is a perspective view schematically showing the top surface and cross sections of a silicon carbide substrate.

The silicon carbide substrate shown in FIG. 15 has a substrate surface miscut by a predetermined angle to the (0001) plane. In FIG. 15, the substrate surface, i.e., the miscut surface is horizontally oriented. Typically, when an element is formed using a silicon carbide substrate, a miscut substrate to the (0001) plane is used. The reason for this is that if a layer is formed by epitaxial growth on a substrate surface miscut by a predetermined angle to the (0001) plane, the polytype can be easily controlled. For example, the surface miscut by approximately 8 degrees from the 4H—SiC(0001) plane in the <11-20> direction (which herein means 1120) is formed as the miscut surface.

However, when a high-temperature process, such as epitaxial growth and heat treatment for dopant activation, is applied to a substrate having the miscut surface as the substrate surface, the step-bunching is developed at the substrate surface along the direction perpendicular to the miscut direction. For example, when the miscut direction is the <11-20> direction, step bunches are formed to protrude along the <1-100> direction perpendicular to the <11-20> direction. The step bunches have a height of approximately 50 through 100 nm, leading to anisotropy in electrical characteristics. The electron mobility in the miscut direction (in the direction transverse to the step bunches) has conventionally differed, for example, by one or more orders of magnitude, from that in the direction perpendicular to the miscut direction (i.e., in the direction parallel to the step bunches).

In view of the above reason, in order to fabricate a semiconductor device capable of passing a large amount of current, electrodes has been required to be arranged such that current flows in the direction perpendicular to the miscut direction. When currents flow through the channel layer 104 in a plurality of directions, electrodes need have been designed such that one of the plurality of directions in which the largest amount of current flows is matched with the direction perpendicular to the miscut direction (for example, Patent Document 1).

Patent Document 1: Japanese Unexamined Patent Publication No. 2001-144288

Patent Document 2: PCT/JP98/01185

DISCLOSURE OF INVENTION

Problems that the Invention is to Solve

As described above, the arrangement of elements has conventionally been determined based on the premise that the formation of step-bunching increases the electron mobility in the direction parallel to the step-bunching and decreases the electron mobility in the direction perpendicular thereto. Even when no step-bunching is developed at the surface of the substrate, crystal defects, such as stacking faults, exist in silicon carbide, and thus the electron mobility in the direction parallel to the miscut direction has sometimes become smaller than that in the direction perpendicular thereto. However, in some cases, the anisotropy in the direction of current travel is reversed. In this case, the electrical characteristics of elements have been deteriorated.

It is an object of the present invention to provide a silicon carbide semiconductor device with more excellent electrical characteristics by taking a measure for solving the above problems.

Means of Solving the Problems

A semiconductor device according to a first aspect of the present invention comprises: a semiconductor substrate; a silicon carbide layer formed on the semiconductor substrate and having its top surface inclined at an angle of 10 degrees or less from a crystal plane in a miscut direction; a gate insulating film formed on the silicon carbide layer; a gate electrode formed on the gate insulating film; a source electrode formed on a part of the silicon carbide layer located to a side of the gate electrode; a drain electrode formed on the back surface of the semiconductor substrate; and a source region formed in a region of the silicon carbide layer located at least under the source electrode, wherein the longest of the edges of the source region extends along the direction perpendicular to the miscut direction in a plan view.

In this way, the source region is arranged to allow current to flow along the miscut direction, thereby improving electrical characteristics. Furthermore, the possibility that the current anisotropy is reversed is eliminated. The reason for the above is as follows. In the known art, step-bunching is developed in the direction perpendicular to the miscut direction of the silicon carbide layer during high-temperature heat treatment, and the electron mobility along the direction parallel to the step-bunching has been large. On the other hand, the semiconductor device of the present invention is formed through the step of heat treatment using a compound containing a group-V element. This reduces the interface state density at the interface between the gate insulating film and the silicon carbide layer, at which a channel layer is formed, and improves the electron mobility along the miscut direction even when the step-bunching is developed at the top surface of the silicon carbide layer. Therefore, the electron mobility along the miscut direction is likely to become higher than that in the direction perpendicular to the miscut direction.

The semiconductor device of the first aspect may further comprise: a well region of a second conductivity type formed in a part of the silicon carbide layer located on a lateral side of the source region and under the source region; and a base electrode electrically connected to the well region.

A direction extending along the direction perpendicular to the miscut direction may be a direction at an inclination of 5 degrees or less from the direction perpendicular to the miscut direction. Therefore, high electron mobility can be achieved.

A channel layer may be formed in a region of the silicon carbide layer located under the gate insulating film.

The channel region may have a multilayer structure including a first silicon carbide layer of at least one layer and a second silicon carbide layer of at least one layer having a higher first-conductivity-type dopant concentration and a smaller thickness than the first silicon carbide layer. In this case, higher electron mobility can be achieved.

When the electron mobility through the silicon carbide layer is larger in the direction perpendicular to the crystal plane than in in-plane directions of the crystal plane, the present invention is effective.

The silicon carbide layer may be 4H—SiC

The top surface of the silicon carbide layer may be a plane inclined from the (0001) plane in the <11-20> direction.

The top surface of the silicon carbide layer may be a plane inclined from the (0001) plane in the <1-100> direction.

When the gate insulating film is formed by thermally oxidizing the upper part of the silicon carbide layer and subjecting the resultant upper part thereof to heat treatment in an atmosphere containing a compound inclusive of a group-V element, the interface state density can be reduced, resulting in the increased electron mobility in the miscut direction.

When the compound inclusive of the group-V element is nitric oxide ($N_xO_y$(x, y=1, 2, ... )), a large effect can be obtained.

A maximum nitrogen concentration is preferably $1 \times 10^{20}$ cm$^{-3}$ through $1 \times 10^{22}$ cm$^{-3}$ both inclusive at the interface between the silicon carbide layer and the gate insulating film, i.e., at the interface between the channel layer and the gate insulating film. In this case, the interface density within the potential range near each of band edges can be reduced enough. Therefore, independently of whether or not the step-bunching is developed between the top surface of the silicon carbide layer and a gate oxide film, an excellent interface is formed therebetween.

Even when the gate electrode is formed by subjecting the upper part of the silicon carbide layer to heat treatment in an atmosphere containing a compound inclusive of a group-V element, an excellent interface between the gate insulating film and the silicon carbide layer can be achieved. In particular, the gate insulating film formed by heat treatment in an atmosphere containing the nitric oxide also works effectively to the present invention.

When the silicon carbide layer contains dopants of the first conductivity type and the semiconductor element of the first aspect comprises: the source electrode formed on a part of the silicon carbide layer located to a side of the gate electrode; the drain electrode formed on the back surface of the semiconductor substrate; and the source region of a first conductivity type formed in a region of the silicon carbide layer located at least under the source electrode and coming into contact with the channel layer; a well region of a second conductivity type formed in a part of the silicon carbide layer to cover one lateral side and the bottom of the source region; and a base electrode electrically connected to the well region, high electron mobility can be achieved in a vertical MOSFET.

The source electrode may be formed using the same conductive film as the base electrode.

The gate electrode may be formed to have a shape in which polygons are hollowed out in a plan view. In this case, the longest of the edges of the hollowed polygons preferably extend along the direction perpendicular to the miscut direction.

In this case, the source electrode may be formed in the shape of polygons in a plan view, and the gate electrode may be formed so as to be located apart from the source electrode and surround the lateral sides of the source electrode.

The gate electrode may be formed in the shape of a polygon in a plan view. In this case, the longest of the edges of the polygon preferably extends along the direction perpendicular to the miscut direction.

In this case, in a plan view, the source electrode may be formed to have a comb shape including a plurality of first rectangular parts arranged in stripes and a first connection part through which the respective one ends of the plurality of first rectangular parts are connected to one another, and the gate electrode may be formed to have a comb shape including a plurality of striped second rectangular parts arranged alternately with the plurality of first rectangular parts and a second connection part through which the respective one ends of the plurality of second rectangular parts are connected to one another.

Herein, a "polygon" and a "comb shape" include shapes having rounded corners or curved edges. When the source region has, for example, an elliptical shape, "the longest of the edges of the source region extends along the direction perpendicular to the miscut direction" means that the major axis of the elliptical shape extends along the direction perpendicular to the miscut direction.

A semiconductor device according to a second aspect of the present invention comprises: a semiconductor substrate; a silicon carbide layer formed on the semiconductor substrate and having its top surface inclined at an angle of 10 degrees or less from a crystal plane in a miscut direction; a gate insulating film formed on the silicon carbide layer; a gate electrode formed on the gate insulating film; a source electrode formed on a part of the silicon carbide layer located to one side of the gate electrode; a drain electrode formed on a part of the silicon carbide layer located to the other side of the gate electrode; and source/drain regions formed apart from each other in regions of the silicon carbide layer located at least under the source and gate electrodes, wherein the opposed two of the edges of the source/drain regions extend along the direction perpendicular to the miscut direction in a plan view.

In this way, the source/drain regions are arranged to allow current to flow along the miscut direction, thereby improving electrical characteristics. The reason for the above is as follows. In the known art, step-bunching is developed in the direction perpendicular to the miscut direction of the silicon carbide layer during high-temperature heat treatment, and the electron mobility along the direction parallel to the step-bunching has been large. On the other hand, the semiconductor element of the present invention is formed through the step of heat treatment using a compound containing a group-V element. This reduces the state density at the interface between the gate insulating film and the silicon carbide layer, at which a channel layer is formed, and improves the electron mobility along the miscut direction even when the step-bunching is developed at the top surface of the silicon carbide layer. Therefore, the electron mobility along the miscut direction is likely to become higher than that in the direction perpendicular to the miscut direction.

The semiconductor device of the second aspect may further comprise: a base region formed in the silicon carbide layer and containing dopants of a first conductivity type; and a base electrode electrically connected to the base region.

The gate electrode may be formed in the shape of a polygon. In this case, the longest of the edges of the polygon preferably extends along the direction perpendicular to the miscut direction.

A direction extending along the direction perpendicular to the miscut direction is a direction at an inclination of 5 degrees or less from the direction perpendicular to the miscut direction. Therefore, a high electron mobility can be achieved.

A channel layer may be formed in a region of the silicon carbide layer located under the gate insulating film.

The channel region may have a multilayer structure including a first silicon carbide layer of at least one layer and a second silicon carbide layer of at least one layer having a higher first-conductivity-type dopant concentration and a smaller thickness than the first silicon carbide layer. In this case, higher electron mobility can be achieved.

When the electron mobility through the silicon carbide layer is larger in the direction perpendicular to the crystal plane than in in-plane directions of the crystal plane, the present invention is effective.

The silicon carbide layer may be 4H—SiC.

The top surface of the silicon carbide layer may be a plane inclined from the (0001) plane in the <11-20> direction.

The top surface of the silicon carbide layer may be a plane inclined from the (0001) plane in the <1-100> direction.

When the gate insulating film is formed by thermally oxidizing the upper part of the silicon carbide layer and subjecting the resultant upper part thereof to heat treatment in an atmosphere containing a compound inclusive of a group-V element, the interface state density can be reduced, resulting in the increased electron mobility in the miscut direction.

When the compound inclusive of the group-V element is nitric oxide ($N_xO_y$(x, y=1, 2, . . . )), a large effect can be obtained.

A maximum nitrogen concentration is preferably $1 \times 10^{20}$ cm$^{-3}$ through $1 \times 10^{22}$ cm$^{-3}$ both inclusive at the interface between the silicon carbide layer and the gate insulating film, i.e., at the interface between the channel layer and the gate insulating film. In this case, the interface density within the potential range near each of band edges can be reduced enough. Therefore, independently of whether or not the step-bunching is developed between the top surface of the silicon carbide layer and a gate oxide film, an excellent interface is formed therebetween.

The source electrode may be formed using the same film as the base electrode.

Effect of the Invention

According to the semiconductor device of the present invention, when the electron mobility reduced due to step-bunching and other unfavorable interface states is improved, this can provide more excellent electrical characteristics than those of a known structure of a semiconductor device.

Figure 3:
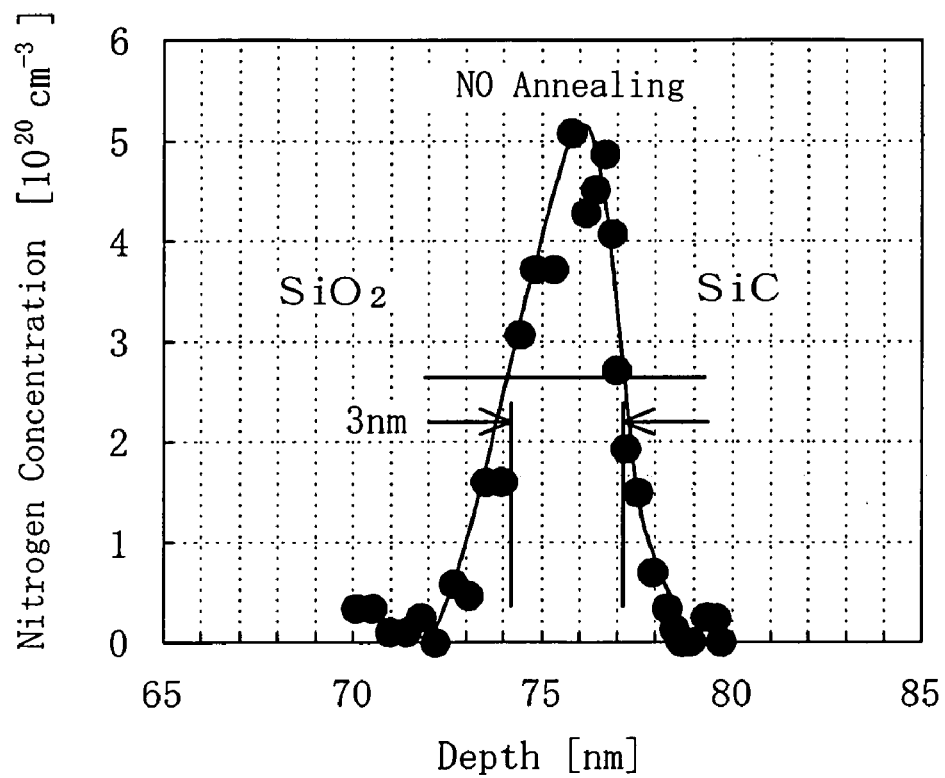
FIG. 3 is a graph showing the nitrogen concentration profile where the nitrogen concentration in the thickness direction of a V-group element containing oxide layer 22 formed according to a production method of the first embodiment was measured by SIMS.
Figure 4A:
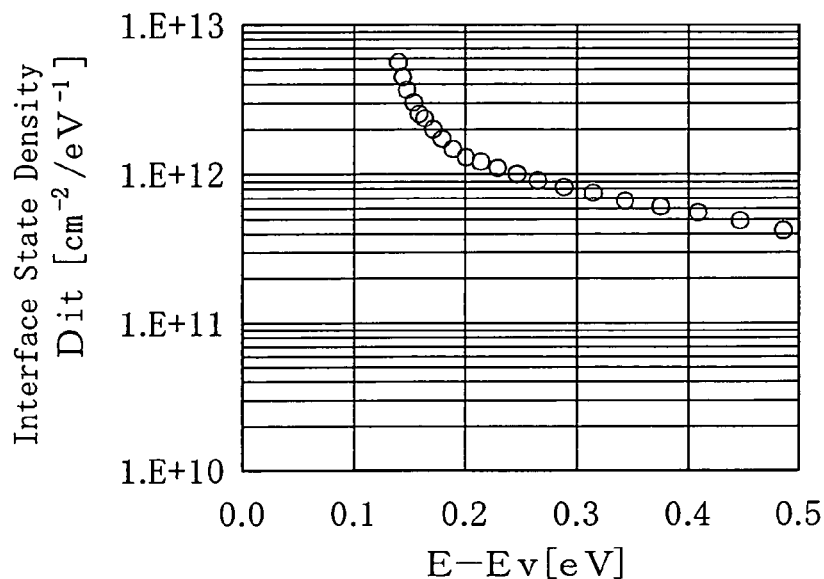
Figure 4B:
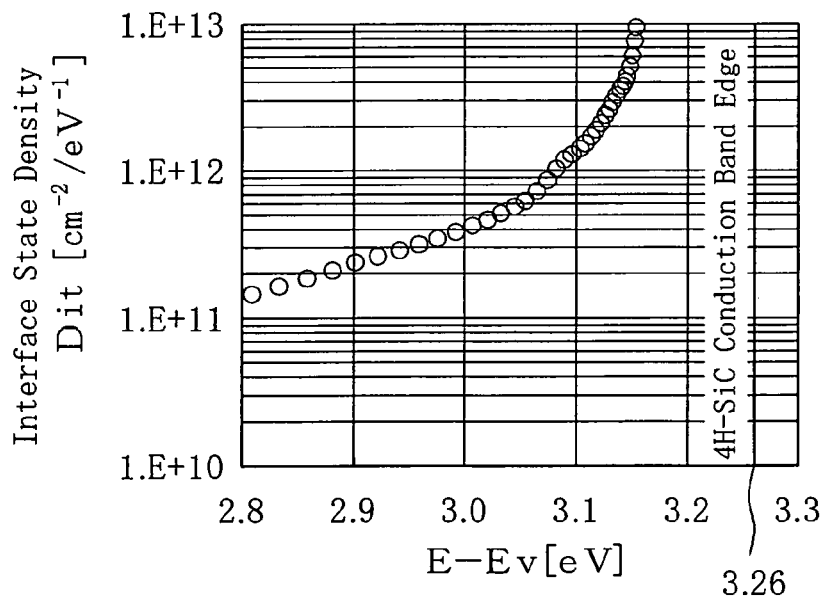

FIGS. 4(a) and 4(b) are graphs showing an interface state density calculated using a High-Low method based on data shown in FIG. 3.

Figure 5:
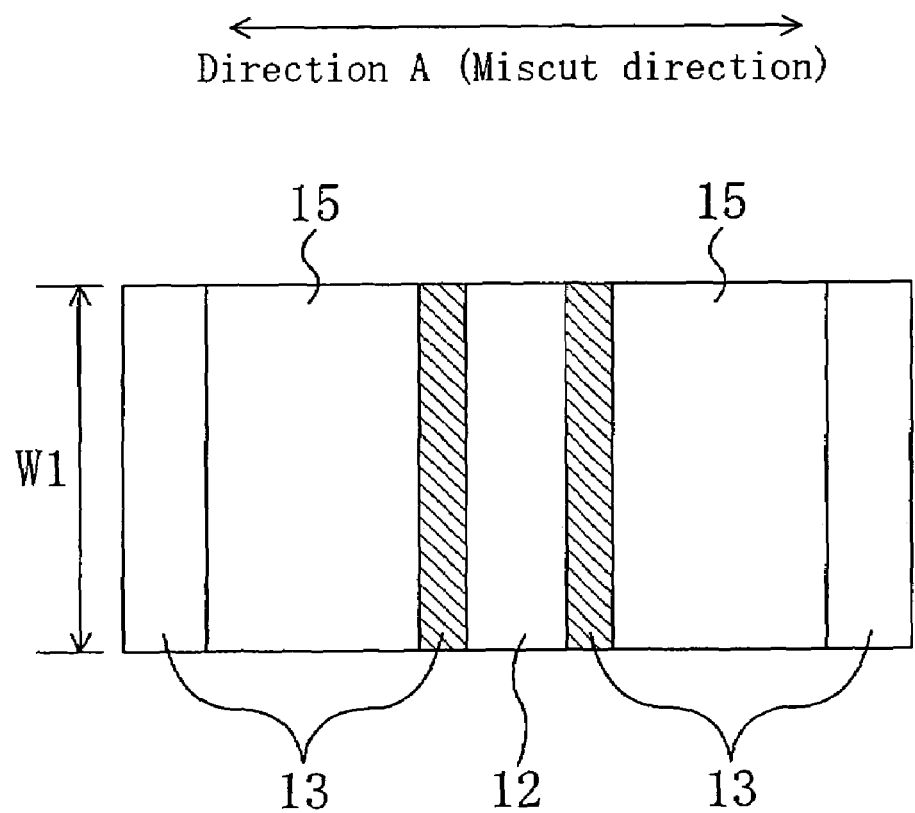

FIG. 5 is a plan view showing the relationship between a direction in which carriers travel and the arrangement of elements in the semiconductor devices shown in FIG. 1.

Figure 6A:
Figure 6B:
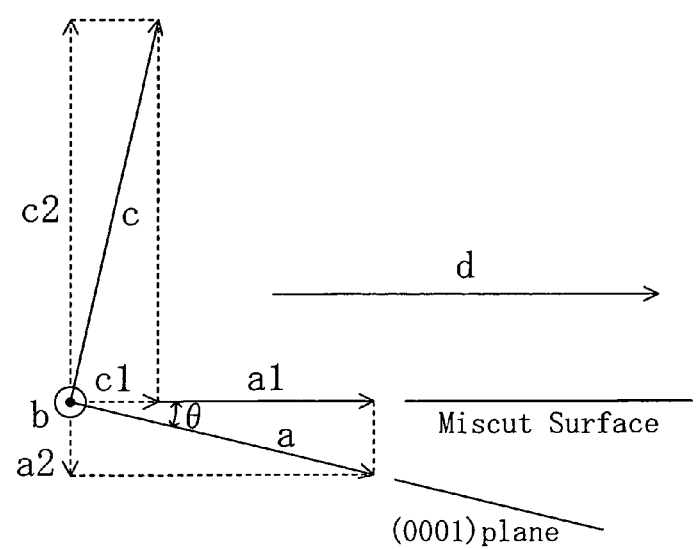

FIG. 6(a) is a diagram showing, by vectors, a direction in which electrons travel and a length over which the electrons travel through a silicon carbide substrate having a (0001) plane as its top surface, and FIG. 6(b) is a diagram showing, by vectors, a direction in which electrons travel and a length over which the electrons travel through a silicon carbide substrate having, as its top surface, a plane inclined at an angle θ from the (0001) plane.

Figure 7A:
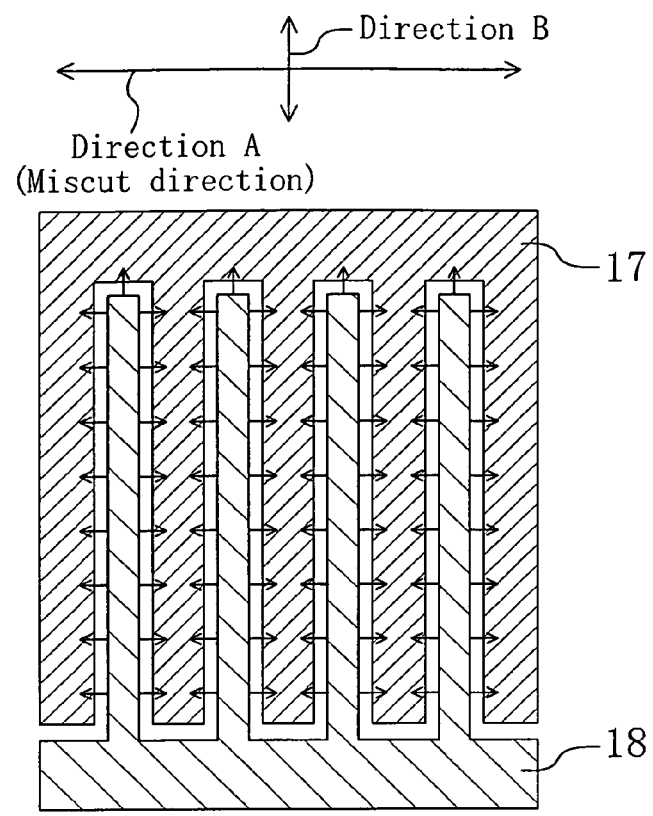
Figure 7B:
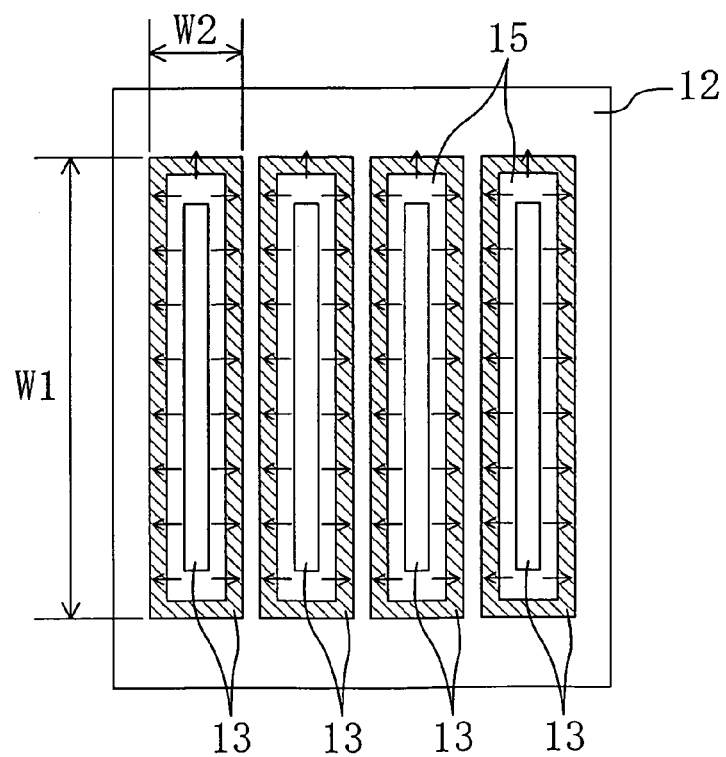

FIGS. 7(a) and 7(b) are diagrams showing the configuration of MOSFETs when gate and source electrodes are arranged in comb form.

FIGS. 8(a) and 8(b) are diagrams showing the configuration of MOSFETs when rectangular unit cells are arranged.

FIGS. 9(a) and 9(b) are diagrams showing the configuration of MOSFETs when hexagonal unit cells are arranged.

Figure 10:
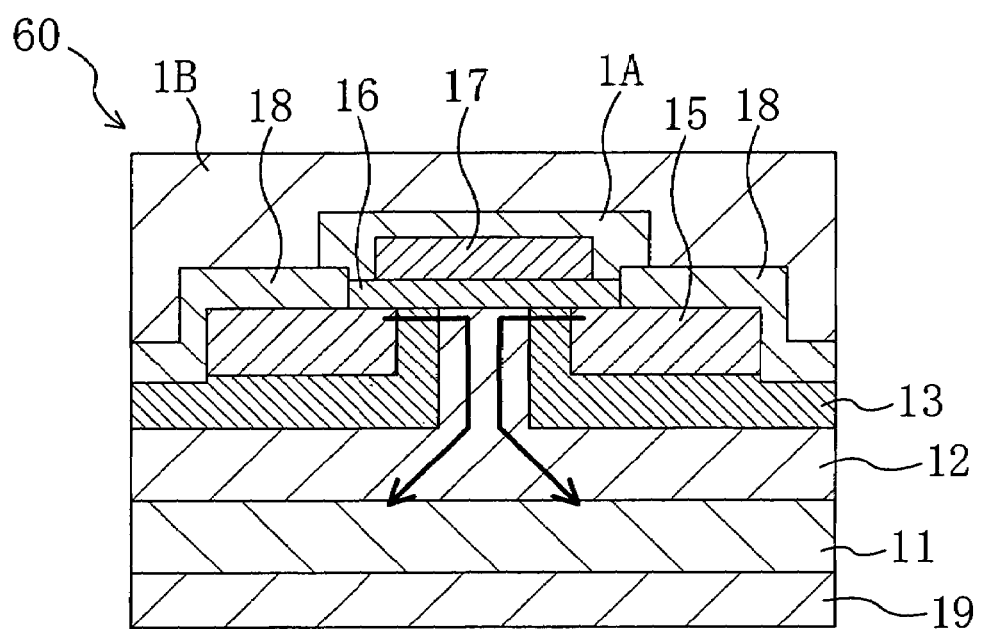

FIG. 10 is a cross-sectional view showing the configuration of vertical inversion-type MOSFETs.

Figure 11A:
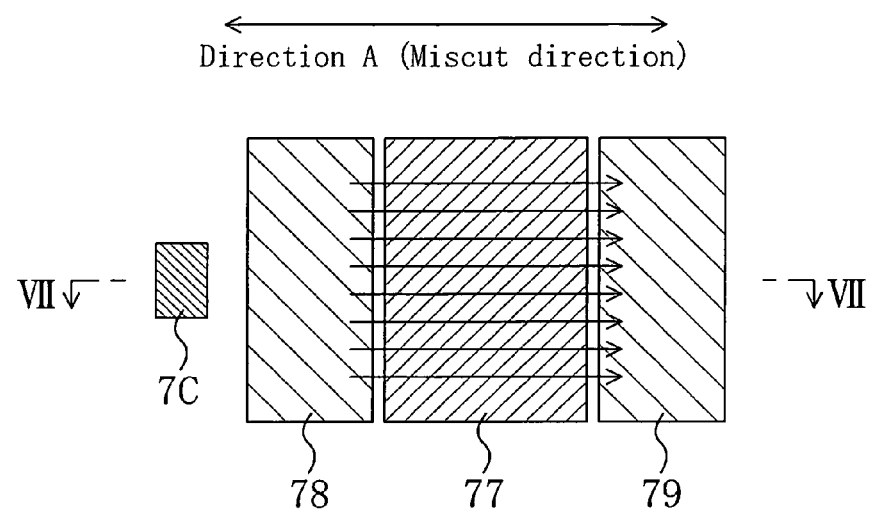
Figure 11B:
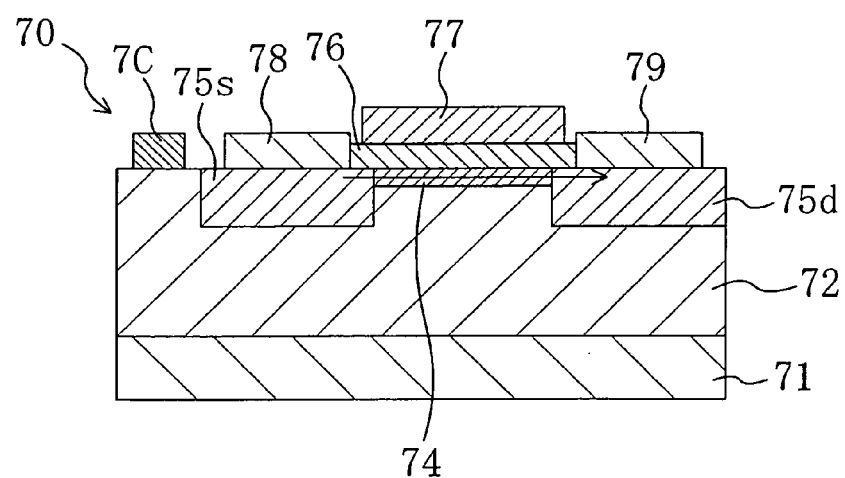

FIGS. 11(a) and 11(b) are cross-sectional views showing typical lateral accumulation-mode MOSFETs using a silicon carbide layer according to a second embodiment.

Figure 12:
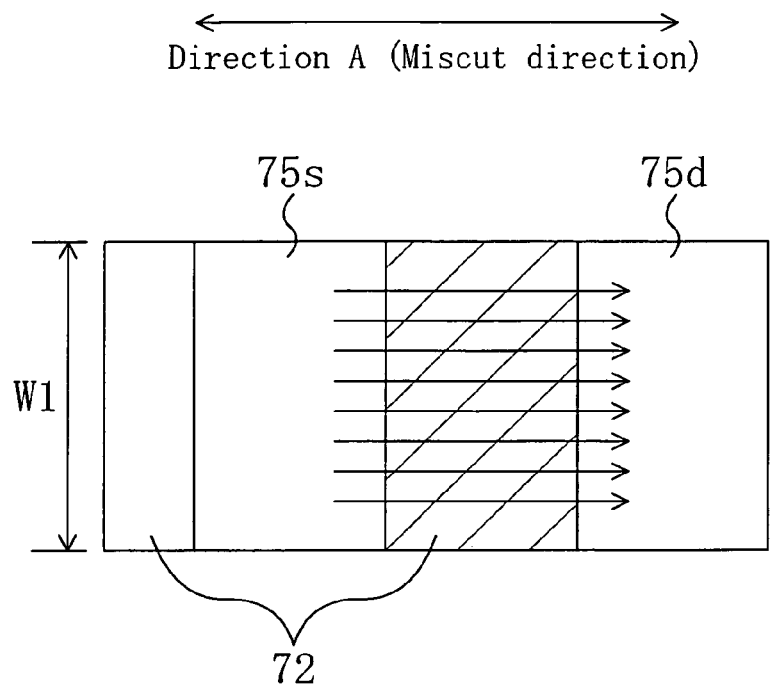

FIG. 12 is a plan view showing the relationship between a direction in which carriers travel and the configuration of elements in the semiconductor device shown in FIG. 11(b).

Figure 13:
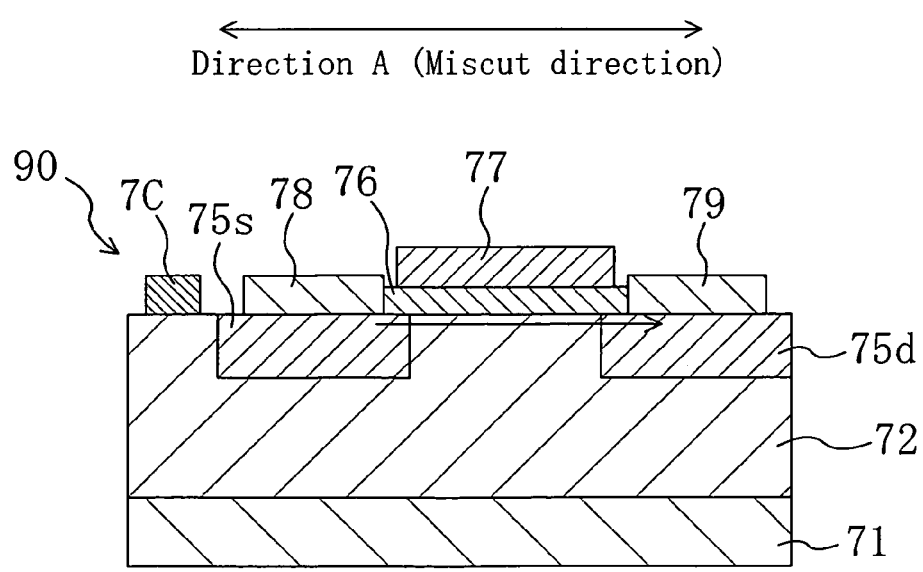

FIG. 13 is a cross-sectional view showing the structure of lateral inversion-type MOSFETs.

Figure 14A:
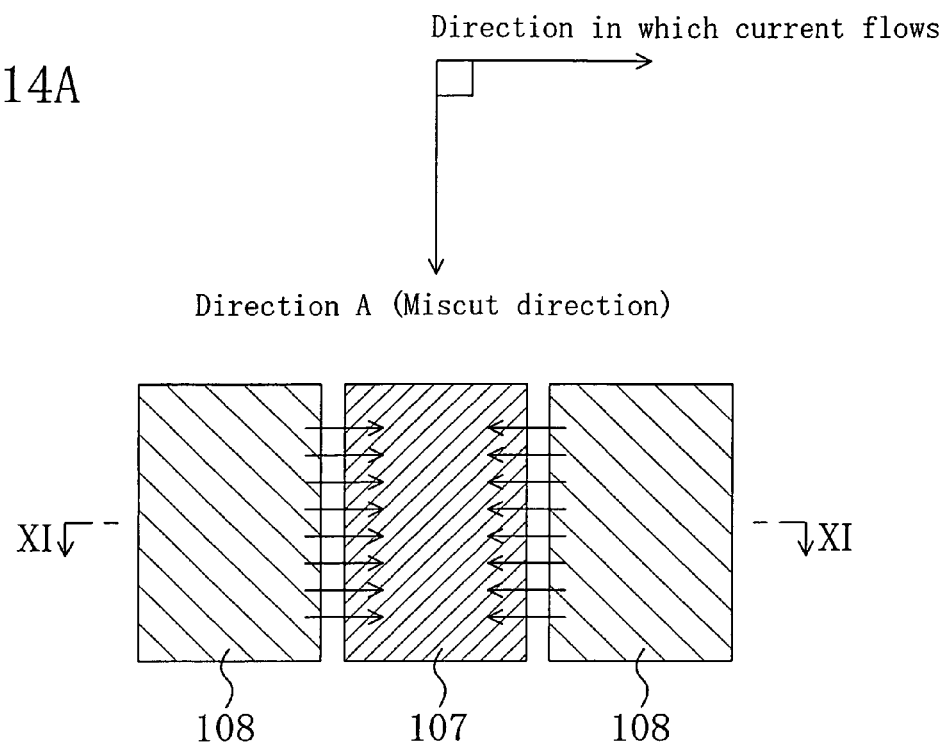
Figure 14B:
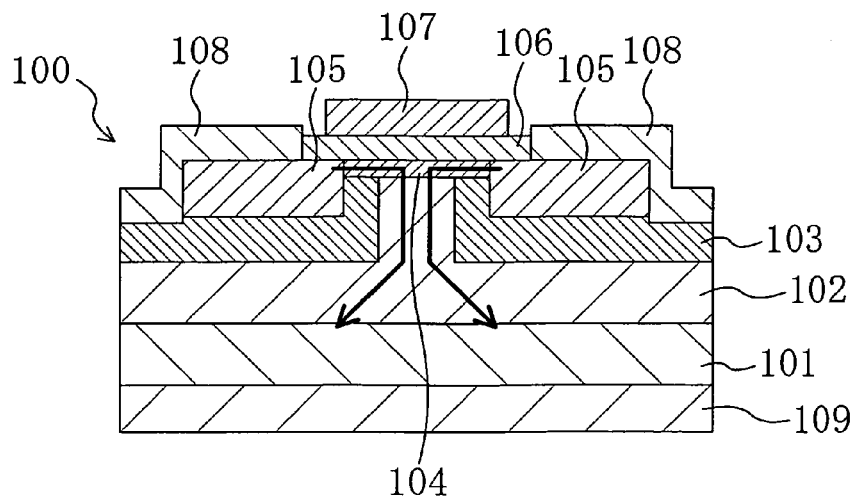

FIGS. 14(a) and 14(b) are diagrams showing a joint between two unit cells of typical vertical accumulation-mode MOSFETs using SiC.

Figure 15:
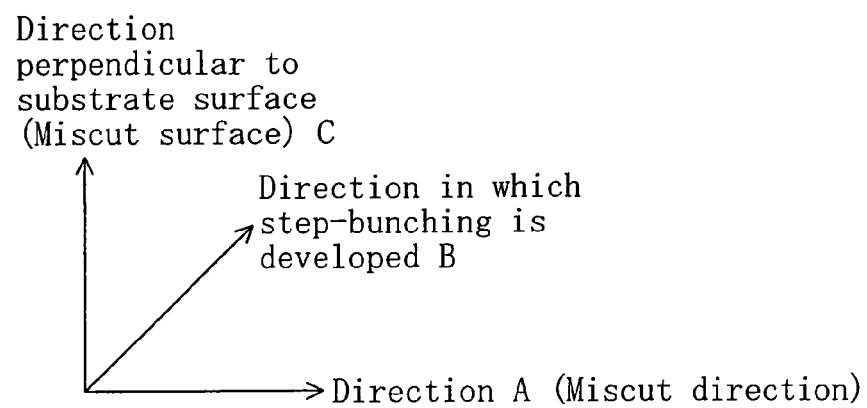
Figure 15:
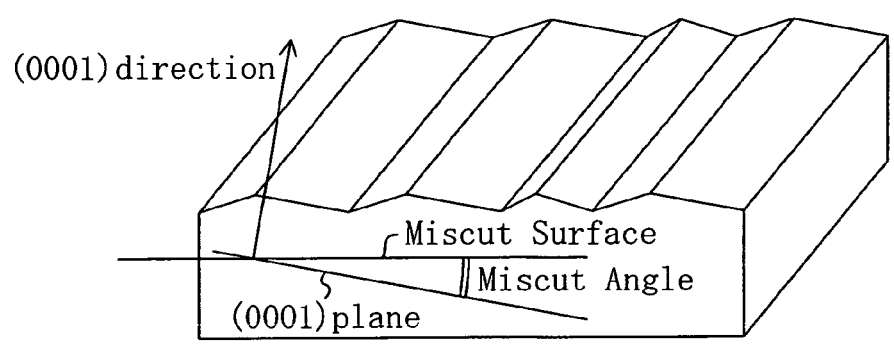

FIG. 15 is a perspective view schematically showing the top surface and cross section of a silicon carbide substrate.

DESCRIPTION OF NUMERALS 1A interlayer insulating film
1B upper interconnect electrode
7C base electrode
10 vertical accumulation-mode MOSFET
11 semiconductor substrate
12 n-type silicon carbide layer
13 p-type well regions
14 channel layer
15 n-type source regions
16 gate insulating film
17 gate electrode
18 source electrodes
19 drain electrode
20 SiC substrate
21 oxide layer
30 chamber
31 vacuum pump
60 vertical inversion-type MOSFET
70 lateral accumulation-mode MOSFET
71 semiconductor substrate
72 p-type silicon carbide layer
74 channel layer
75d drain region
75s source region
76 gate insulating film
77 gate electrode
78 source electrode
79 drain electrode
90 lateral inversion-type MOSFET
101 semiconductor substrate
102 n-type silicon carbide layer
103 p-type well regions
104 channel layer
105 source regions
106 gate insulating film
107 gate electrode
108 source electrodes
109 drain electrode

BEST MODE FOR CARRYING OUT THE INVENTION

Embodiments of the present invention will be described hereinafter with reference to the drawings.

(Embodiment 1)

Figure 1A:
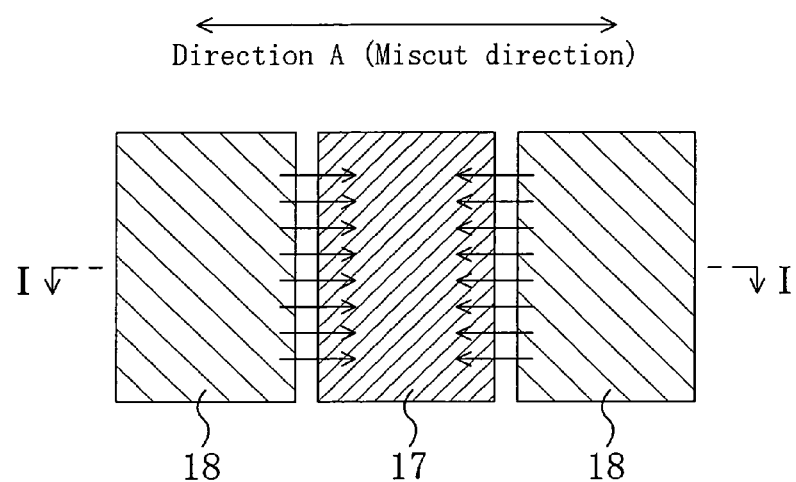
FIGS. 1(a) and 1(b) are cross-sectional views showing a joint between two unit cells of typical vertical accumulation-mode MOSFETs using a silicon carbide layer in a first embodiment.
Figure 1B:
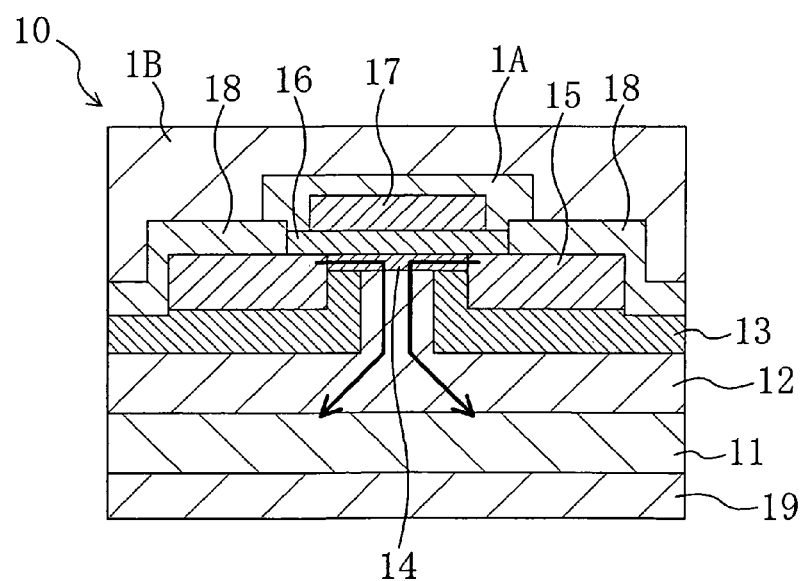

FIGS. 1(a) and 1(b) are cross-sectional views showing a joint between two unit cells of typical vertical accumulation-mode MOSFETs using a silicon carbide layer in a first embodiment. FIG. 1(a) is a plan view showing some of electrodes of the MOSFETs, and FIG. 1(b) is a cross-sectional view taken along the line I—I in FIG. 1(a).

As shown in FIGS. 1(a) and 1(b), a semiconductor device of this embodiment has an n⁺-type 4H—SiC(0001) semiconductor substrate 11. The semiconductor substrate 11 has a surface miscut by approximately 8 degrees in the <11-20> direction, and its resistivity is approximately 0.02 Ωcm². An n-type 4H—SiC(0001) silicon carbide layer 12 is formed on the semiconductor substrate 11 to have a thickness of approximately 15 μm and doped with nitrogen at a concentration of $3 \times 10^{15}$ cm⁻³. The n-type silicon carbide layer 12 is formed on the semiconductor substrate 11 by epitaxial growth, and the influence of the semiconductor substrate 11 causes the top surface of the n-type silicon carbide layer 12 to have an off angle in the <11-20> direction.

P-type well regions 13 are formed in regions of the upper part of the n-type silicon carbide layer 12 located to both lateral sides of the joint between the two unit cells in the following manner: the n-type silicon carbide layer 12 is doped with, for example, aluminum at a concentration of approximately $2 \times 10^{18}$ cm⁻³ to a depth of approximately 0.8 μm, and then the aluminum-doped silicon carbide layer 12 is annealed at a high temperature of approximately 1700 degrees.

A channel layer 14 of n-type 4H—SiC is formed to extend over a region of the top surface of the n-type silicon carbide layer 12 interposed between the two p-type well regions and the top surfaces of the two p-type well regions. In this embodiment, the channel layer 14 is a δ-doped layer obtained by alternately stacking undoped layers and doped layers containing n-type dopants at a concentration of approximately $5 \times 10^{17}$ cm⁻³. The channel layer 14 has a thickness of approximately 0.2 μm.

Source regions 15 are formed in the upper parts of the p-type well regions 13 to come into contact with the lateral sides of the channel layer 14 in the following manner: the p-type well regions 13 are doped with, for example, nitrogen at a concentration of approximately $1 \times 10^{19}$ cm⁻³ to a depth of approximately 0.3 μm, and then the nitrogen-doped p-type well regions 13 are annealed at a high temperature of approximately 1700 degrees.

Basically, source regions 15 are formed by doping respective parts of the p-type well regions with n-type dopants, and a MOSFET 10 is a so-called double implantation MOSFET (DIMOSFET). In FIG. 1, the source regions are configured such that the channel layer is interposed therebetween. A channel layer is deposited on the formed p-type well regions and furthermore n-type dopants are implanted into the n-type silicon carbide layer 12 from above the channel layer, thereby forming source regions. However, a semiconductor device may be achieved, for example, by forming p-type well regions and source regions and then a channel layer.

A gate insulating film 16 with a thickness of approximately 60 nm is formed on the channel layer 14 and respective parts of the source regions 15 in the following manner: the respective upper parts of the source regions 15 and the channel layer 14 are thermally oxidized and then subjected to heat treatment under an atmosphere containing a V-group element. A method for this heat treatment will be described below.

A gate electrode 17 of aluminum is formed on the gate insulating film 16.

Source electrodes 18 of nickel are formed from on the source regions 15 to on respective parts of the n-type silicon carbide layer 12 located to the outermost lateral sides of the source regions 15 in the following manner: a nickel film is formed and then subjected to heat treatment at a temperature of approximately 1000 degrees. This heat treatment allows the source electrodes 18 to make ohmic contact with the source regions 15. The source electrodes 18 function also as base electrodes electrically connected to the p-type well regions 13. In order to reduce the electrical resistance between the source electrodes 18 and the p-type well regions 13, $p^+$-type ion implantation regions may be formed by implanting ions of aluminum into respective parts of the p-type well regions 13 located at their interfaces with the source electrodes 18 at a higher concentration than that in the respective other parts thereof.

A drain electrode 19 of nickel is formed on the back surface of the semiconductor substrate 11 in the following manner: a nickel film is formed and then subjected to heat treatment at a temperature of approximately 1000 degrees. This heat treatment allows the drain electrode 19 to make ohmic contact with the semiconductor substrate 11.

The gate electrode 17 is covered with an interlayer insulating film 1A, and the interlayer insulating film 1A and the source electrodes 18 are covered with an upper interconnect electrode 1B.

In order to turn the MOSFET 10 of this embodiment ON, a positive voltage is applied to the drain electrode 19, the source electrodes 18 are grounded, and a positive voltage is applied to the gate electrode 17. In this way, switching operations of the MOSFET 10 can be achieved.

When the MOSFET 10 is thus turned ON, electrons serving as carriers initially flow in the direction parallel to the substrate surface as shown in FIGS. 1(*a*) and 1(*b*). In this relation, unlike the known art, in this embodiment, electrons flow in the direction parallel to the offcut direction A. Thereafter, the electrons flow in the direction perpendicular to the substrate surface as shown in FIG. 1(*b*). The arrows shown in FIGS. 1(*a*) and 1(*b*) show directions in which electrons serving as carriers travel. Current flows in the opposite directions to these arrows.

A method in which the gate insulating film 16 is formed and then subjected to heat treatment will be described in detail with reference to the drawings. This method is disclosed in Japanese Patent Application Nos. 2003-350244 and 2004-271321 previously filed by the present applicant. The contents of the above-described applications are incorporated herein by reference.

Figure 2A:
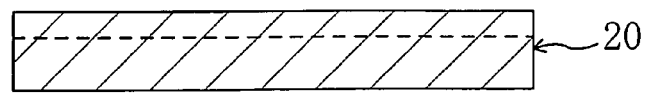
FIGS. 2(a) through 2(c) are cross-sectional views showing a procedure for forming a SiC-oxide layered structure.
Figure 2B:
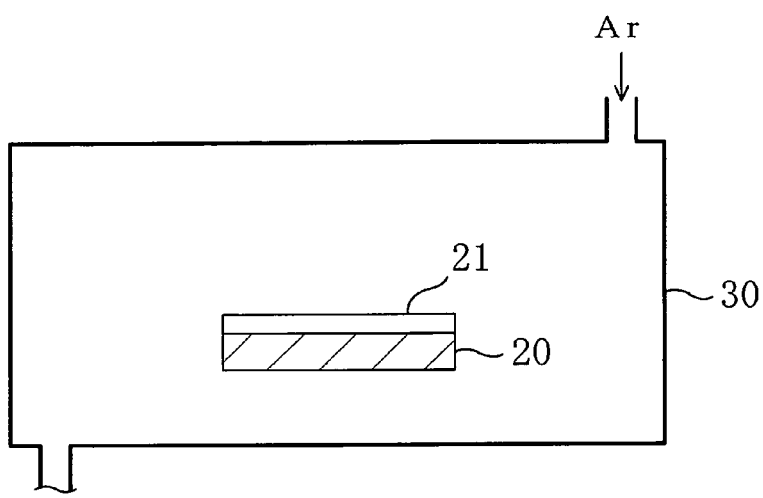
Figure 2C:
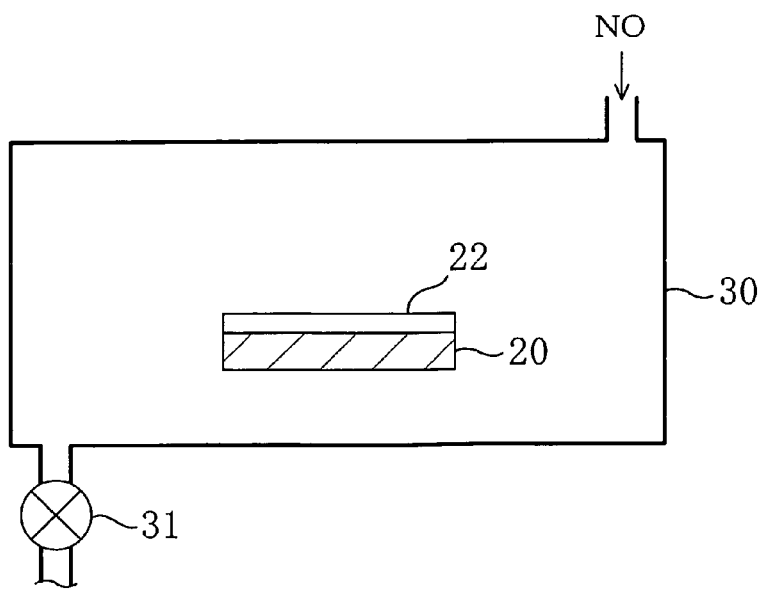

FIGS. 2(*a*) through 2(*c*) are cross-sectional views showing a procedure for forming a SiC-oxide layered structure. Although in this embodiment nitrogen is used as a V-group element, any other V-group element, such as phosphorus (P) and arsenic (As), may be used.

First, in the process step shown in FIG. 2(*a*), a SiC substrate 20 that is a 4H—SiC(0001) substrate is prepared. The upper part of the SiC substrate 20 (a part of the SiC substrate 20 located above the broken line shown in FIG. 2(*a*)) is a 4H—SiC(0001) layer formed by epitaxial growth. The principal surface of the SiC substrate 20 (an epitaxially grown SiC layer) is smoothed by MCP (mechano-chemical polishing) such that the difference in surface levels (maximum surface roughness Rmax) become 10 nm or less. However, this smoothing process is not necessarily required.

Next, in the process step shown in FIG. 2(*b*), the SiC substrate 20 is placed in a chamber 30 and heated under an oxidizing atmosphere, thereby forming an oxide layer 21 (primarily containing $SiO_2$) on the SiC substrate 20 to have an average thickness of approximately 60 nm. In this case, an oxidizing temperature is 1000° C. or more, preferably 1050 through 1300° C. In order to produce an oxidizing atmosphere, a gas containing at least one of oxygen and water vapor need be allowed to flow through the chamber 30. Thereafter, the oxide layer 21 is annealed in an inert gas atmosphere (Ar, $N_2$, He, Ne, or other gases) at a temperature of 1000° C. or more (for example, 1000 through 1150° C.). The oxide layer 21 is densified in advance by this annealing process.

Next, in the process step shown in FIG. 2(*c*), the SiC substrate 20 is moved into another chamber 30 having an exclusion device (not shown) and a vacuum pump 31 serving as a pressure reducer. Then, a NO gas (or a gas containing a V-group element other than nitrogen (e.g., phosphorus (P)) is introduced into the chamber 30 at a flow rate of 500 (ml/min) while the inside pressure of the chamber 30 is reduced by the vacuum pump 31 to about 150 Torr ($2.0 \times 10^4$ Pa), and the inside of the chamber 30 is heated to a temperature sufficient for nitrogen (or a V-group element other than nitrogen) to be diffused into the oxide layer 21 (e.g., about 1150° C.). Under the reduce pressure condition, the oxide layer 21 is exposed to the V-group element containing gas, such as nitrogen, whereby a V-group element, such as nitrogen, is diffused into the oxide layer 21. As a result, a denser V-group element containing oxide layer 22 having a large relative dielectric constant is obtained. The exposure is performed for a time period which is sufficient for forming the dense V-group element containing oxide layer 22 and sufficient for obtaining improved characteristics of the V-group element containing oxide layer 22 (e.g., 1 hour). After the above-mentioned process steps, heat treatment is completed.

FIG. 3 is a graph showing the nitrogen concentration profile where the nitrogen concentration in the thickness direction of the V-group element containing oxide layer 22 formed according to the production method of this embodiment was measured by SIMS. More particularly, FIG. 3 shows the extracted concentration distribution of the peak portion (region near the $SiO_2$—SiC interface). The data shown in FIG. 3 was obtained by quantitating nitrogen in the $SiO_2$—SiC interface with $CsN^{147}$. As shown in FIG. 3, the half-width of the peak portion was 3 nm, from which it is seen that nitrogen was introduced into a very narrow area with high concentration.

FIGS. 4(*a*) and 4(*b*) show the interface state density calculated using the High-Low method based on the data shown in FIG. 3. In the graphs of FIGS. 4(*a*) and 4(*b*), the horizontal axis indicates the potential difference from valence band Ev (E–Ev (eV)), and the vertical axis indicates interface state density Dit ($cm^{-2}eV^{-1}$). In the case where the carrier in a MISFET is an electron, the interface state which functions as a trap is an interface state in the potential range near the conduction band edge (E–Ev=2.95 eV to 3.05 eV). In the case where the carrier is a hole, the interface state which functions as a hole trap is an interface state in the potential range near the valence band edge (E–Ev=0.3 eV to 0.4 eV). However, as shown in FIGS. 4(a) and 4(b), in this embodiment, the interface state density of $1\times10^{12}$ $cm^{-2}\cdot eV^{-1}$ or lower was obtained in the potential range near each band edge. The average nitrogen concentration in the entire V-group element containing oxide layer 22 was $8.3\times10^{19}$ $cm^{-3}$.

Thus, when a V-group element, such as nitrogen, is contained in the V-group element containing oxide layer 22, the interface state density which functions as a carrier trap is decreased, and accordingly, the carrier mobility is improved.

Especially because the maximum value of the nitrogen concentration in the lower part of the V-group element containing oxide layer 22 is equal to or higher than $1\times10^{20}$ $cm^{-3}$ and equal to or lower than $1\times10^{22}$ $cm^{-3}$, the effect of improving the relative dielectric constant and the effect of decreasing the interface state density are significantly large.

Next, the arrangement of the semiconductor devices of this embodiment will be described while being compared with that in the known art.

In the known art, as shown in FIG. 14, step-bunching is developed at the top surface of a substrate by the influence of high-temperature heat treatment for activating dopants ion-implanted into a layer. Since the step-bunching is developed along the direction perpendicular to the miscut direction, the arrangement of electrodes or other elements has conventionally been determined such that more carriers flow in the direction perpendicular to the miscut direction.

On the other hand, in this embodiment, elements are arranged such that more carriers flow substantially parallel to the miscut direction. FIG. 5 is a plan view showing the relationship between the direction in which carriers travel and the arrangement of elements in the semiconductor devices shown in FIG. 1. In FIG. 5, the gate electrode 17, the source electrodes 18 and some other elements are not shown, and only the n-type silicon carbide layer 12, the p-type well regions 13 and the n-type source regions 15 are shown. Although the channel layer 14 is not shown, the channel layer 14 is located on diagonally shaded regions of the p-type well regions 13. In a vertical MOSFET as shown in FIG. 5, carriers flow from the source regions 15 toward the n-type silicon carbide layer 12. Elements are arranged such that the direction in which the carriers flow becomes substantially parallel to the miscut direction.

-Principle on which the Electron Mobility Increases in the Miscut Direction-

The known semiconductor device has the following anisotropy: the electron mobility is larger in the direction perpendicular to the miscut direction than in the direction parallel thereto. On the other hand, in the semiconductor device of this embodiment, this anisotropy is reversed. The reason for this is that in this embodiment, heat treatment is performed using a gas containing nitrogen and oxygen, thereby reducing the interface state density at the interface between a silicon carbide layer and a gate insulating film and improving the electron mobility along the miscut direction. The reason why the electron mobility of the silicon carbide substrate is large in the cut-off direction will be examined hereinafter.

FIG. 6(a) is a diagram showing, by vectors, a direction in which electrons travel and a length over which the electrons travel through a silicon carbide substrate having a (0001) plane as its top surface. In FIG. 6(a), a vector parallel to the (0001) plane (designated crystal plane S) and the paper is designated as a vector a, a vector parallel to the (0001) plane but perpendicular to the paper is designated as a vector b, and a vector perpendicular to the (0001) plane is designated as a vector c.

In this case, the electron mobility of the silicon carbide layer whose top surface is the (0001) plane becomes larger in the direction perpendicular to the substrate surface than in in-plane directions of the substrate. More particularly, the vector c shown in FIG. 6(a) is larger than the vectors a and b. The vectors a and b have the same length.

Next, the case where the silicon carbide substrate is a miscut substrate will be examined. FIG. 6(b) is a diagram showing, by vectors, a direction in which electrons travel and a length over which the electrons travel through a silicon carbide substrate having, as its top surface, a plane inclined at an angle θ from the (0001) plane.

In FIG. 6(b), each of the vectors a and c are broken down into a vector extending along the miscut direction and a vector extending along the direction perpendicular to the miscut direction. The vectors corresponding to the vector a are designated as vectors a1 and a2, and the vectors corresponding to the vector c are designated as c1 and c2. In this case, when a vector indicating the electron mobility in the miscut direction is designated as a vector d, the vector d is expressed by the sum of the vectors a1 and c1.

Since in this embodiment the vector c is larger than the vector a, the vector d becomes larger than the vector a. On the other hand, since the vector b is perpendicular to the miscut direction, the electron mobility in the vector-b direction does not vary between when the top surface of the silicon carbide layer is the (0001) plane and when it is a miscut surface. Since the vectors a and b have the same length, the vector d is obviously larger than the vector b.

In view of the above, the electron mobility (vector d) in the miscut direction becomes larger than that (vector b) in the direction perpendicular to the miscut direction.

As a matter of course, even when vectors indicating directions other than the vectors b and d are taken into account, it is obvious that the electron mobility in the miscut direction becomes largest within the miscut substrate surface.

The electron mobility in the miscut direction is improved by a synergistic effect resulting from the combination of the above-mentioned effect of the vectors and the effect of reducing the interface state density at the interface between the silicon carbide layer and the gate insulating film by subjecting the silicon carbide layer to heat treatment using a gas containing nitrogen and oxygen.

Example of the Arrangement of Electrodes-

Shown in FIG. 1 is an example in which current is allowed to flow only along the direction parallel to the miscut direction A at the joint between the two unit cells. However, actually, current is allowed to flow along a plurality of directions in many vertical semiconductor devices. In this case, elements are arranged such that one of the plurality of directions along which the largest amount of current flows becomes parallel to the miscut direction. The structure of the vertical semiconductor device will be described hereinafter.

FIRST ARRANGEMENT EXAMPLE

In vertical MOSFETs, a source electrode 18 and a gate electrode 17 may be arranged in stripes (or in comb form). This case will be described with reference to FIGS. 7(*a*) and 7(*b*).

FIGS. 7(*a*) and 7(*b*) are diagrams showing the configuration of MOSFETs when the gate and source electrodes are arranged in comb form. FIG. 7(*a*) shows the configuration of a gate electrode 17 and a source electrode 18, and FIG. 7(*b*) shows the configuration of an n-type silicon carbide layer 12, p-type well regions 13 and n-type source regions 15. As shown in FIG. 7(*a*), a plurality of rectangular parts of the source electrode 17 are arranged in stripes. Respective one ends of the plurality of rectangular parts of the source electrode 17 are electrically connected to one another by making contact with a connection part of the source electrode 17 extending perpendicularly to the direction along which the rectangular parts thereof extend. A plurality of rectangular parts of the gate electrode 18 are arranged in stripes alternately with the rectangular parts of the source electrode 17. Respective one ends of the plurality of rectangular parts of the gate electrode 18 are electrically connected to one another by making contact with a connection part of the gate electrode 18 extending perpendicularly to the direction along which the rectangular parts thereof extend. A channel region is arranged in diagonally shaded regions shown in FIG. 7(*b*). In this case, the directions in which carriers travel are given two directions, i.e., the directions A and B. The channel region primarily extends along the direction perpendicular to the direction A. In view of the above, elements are arranged such that the width W1 of the channel region through which current is allowed to flow along the direction A is equal to or larger than the other width W2 of the channel region. The longest edges of each n-type source region 15 are also oriented perpendicularly to the miscut direction A.

SECOND ARRANGEMENT EXAMPLE

A vertical MOSFET is arranged for each of polygonal unit cells, in each of which the lateral sides of a source electrode may be surrounded by a gate electrode. This case will be described with reference to FIGS. 8(*a*) and 8(*b*).

FIGS. 8(*a*) and 8(*b*) are diagrams showing the configuration of vertical MOSFETs when rectangular unit cells are arranged. FIG. 8(*a*) shows the configuration of a gate electrode 17 and a source electrode 18, and FIG. 8(*b*) shows the configuration of an n-type silicon carbide layer 12, p-type well regions 13 and n-type source regions 15. Channel regions are arranged in diagonally shaded regions shown in FIG. 8(*b*).

In this case, the directions in which carriers travel are given two directions, i.e., the directions A and B. When the longitudinal direction of each unit cell is set perpendicularly to the direction A, parts of each channel region extending along the direction perpendicular to the direction A become longer than parts of the channel region extending along the direction parallel thereto. In view of the above, as shown in FIG. 8(*b*), elements are arranged such that the width W1 of the channel region through which current is allowed to flow along the direction A is equal to or larger than the other width W2 thereof. The longest edges of each n-type source region 15 are also oriented perpendicularly to the miscut direction A.

Although in this example a case where the unit cell is rectangular was described, the unit cell may have a polygonal shape, such as a parallelogram or a rhombus. FIGS. 9(*a*) and 9(*b*) are diagrams showing the configuration of vertical MOSFETs when hexagonal unit cells are arranged. FIG. 9(*a*) shows the configuration of a gate electrode 17 and source electrodes 18, and FIG. 9(*b*) shows the configuration of a n-type silicon carbide layer 12, p-type well regions 13 and n-type source regions 15. Channel regions are arranged in diagonally shaded regions shown in FIG. 9(*b*).

In this case, there are primarily three directions in which carriers travel, i.e., directions A, C and D. When the longest two of the edges of each hexagonal unit cell are arranged perpendicularly to the direction A, parts of the channel regions extending along the direction perpendicular to the direction A become longer than parts thereof extending along the direction perpendicular to the directions C and D. In view of the above, as shown in FIG. 9(*b*), elements are arranged such that the width W1 of each of parts of the channel regions through which current flows along the direction A becomes equal to or larger than the width W2 of each of the other parts of the channel regions through which current flows along the other directions. The longest edges of each n-type source region 15 are also oriented perpendicularly to the miscut direction A.

The method described in this embodiment can be applied not only to the case where the δ-doped layer is used as the channel layer but also to the case where the channel layer is a usual n-type dopant layer.

Furthermore, the method described in this embodiment can also be applied to a vertical inversion-type MOSFET 60. FIG. 10 is a cross-sectional view showing the configuration of vertical inversion-type MOSFETs. Unlike FIG. 1, in FIG. 10, the channel layer (shown in FIG. 1) is not formed. Since the other structure of each MOSFET is the same as that in FIG. 1, a description thereof is not given.

(Embodiment 2)

FIGS. 11(*a*) and 11(*b*) are cross-sectional views showing typical lateral accumulation-mode MOSFETs using a silicon carbide layer according to a second embodiment. FIG. 11(*a*) is a plan view showing some of electrodes of the MOSFETs when seen from above, and FIG. 11(*b*) is a cross-sectional view taken along the line VII—VII in FIG. 11(*a*).

As shown in FIGS. 11(*a*) and 11(*b*), a semiconductor device of this embodiment has a semi-insulating 4H—SiC (0001) semiconductor substrate 71. The semiconductor substrate 71 has a surface miscut by approximately 8 degrees in the <11-20> direction. A 4H—SiC(0001) p-type silicon carbide layer 72 is formed on the semiconductor substrate 71 to have a thickness of approximately 5 μm and doped with aluminum at a concentration of $5 \times 10^{15}$ cm$^{-3}$.

An n-type channel layer 74 is formed in the middle region of the upper part of the p-type silicon carbide layer 72. In this embodiment, the channel layer 74 is a δ-doped layer obtained by alternately stacking undoped layers and doped layers containing n-type dopants at a concentration of approximately $5 \times 10^{17}$ cm$^{-3}$. The channel layer 74 has a thickness of approximately 0.2 μm.

A source region 75*s* and a drain region 75*d* are formed in regions of the p-type silicon carbide layer 72 located to both sides of the channel layer 74 in the following manner: for example, the p-type silicon carbide layer 72 is doped with nitrogen at a concentration of approximately $1 \times 10^{19}$ cm$^{-3}$ to a depth of about 0.3 μm, and then the nitrogen-doped p-type silicon carbide layer 72 is annealed at a high temperature of about 1700 degrees.

In principle, the source region 75*s* and the drain region 75*d* are formed by doping parts of a p-type well region with n-type dopants. A MOSFET 70 is a so-called double implantation MOSFET (DIMOSFET).

In FIGS. 11(a) and 11(b), the channel layer is sandwiched between the source and drain regions. A p-type well region is formed, then a channel layer is deposited thereon, and furthermore the p-type well region is doped with n-type dopants from above the channel layer, thereby forming source and drain regions. A semiconductor device may be achieved by forming a p-type well region and source and drain regions and then a channel layer.

A gate insulating film 76 with a thickness of about 60 nm is formed over the channel layer 74 and respective one lateral end parts of the source region 75s and the drain region 75d in the following manner: the respective upper parts of the channel layer 74, the source region 75s and the drain region 75d are thermally oxidized, and then the thermally oxidized upper parts thereof are subjected to heat treatment in an atmosphere containing a V-group element.

A gate electrode 77 of aluminum is formed on part of the gate insulating film 76.

A source electrode 78 of nickel is formed on part of the source region 75s, and a drain electrode 79 of nickel is formed on part of the drain region 75d. A source electrode 78 and a drain electrode 79 are formed in the following manner: a nickel film is formed, and then the nickel film is subjected to heat treatment at a temperature of about 1000 degrees. This heat treatment allows the source region 75s and the drain region 75d to make ohmic contact with the source electrode 78 and the drain electrode 79, respectively.

A base electrode 7C is formed on a region of the p-type silicon carbide layer 72 located to the outer lateral side of the source region 75s to electrically connect the p-type silicon carbide layer 72 to the outside. In order to reduce the electrical resistance between the base electrode 7C and the p-type silicon carbide layer 72, a p$^+$-type ion implantation region may be formed by implanting ions of aluminum into a part of the p-type silicon carbide layer 72 located at the interface therebetween at a higher concentration than that in the other part thereof. Furthermore, the source electrode 78 and the base electrode 7C may be electrically joined with each other or made of the same conductive film.

In order to turn the MOSFET 70 of this embodiment ON, a positive voltage is applied to the drain electrode 79, the source electrode 78 and the base electrode 7C are grounded, and a positive voltage is applied to the gate electrode 77. In this way, switching operations of the MOSFET 70 can be achieved.

When the MOSFET 70 is thus turned ON, electrons serving as carriers flow from the source region 75s toward the drain region 75d in the direction parallel to the substrate surface as shown in FIGS. 11(a) and 11(b). In this relation, unlike the known art, in this embodiment, electrons flow in the direction parallel to the miscut direction A. The configuration of semiconductor devices of this embodiment will be described below with reference to FIG. 12. FIG. 12 is a plan view showing the relationship between a direction in which carriers travel and the configuration of elements in the semiconductor devices shown in FIG. 11(b). In FIG. 12, the gate electrode 77, the source electrode 78, the drain electrode 79, and other elements are not shown, and only the p-type silicon carbide layer 72, the n-type source region 75s and the n-type drain region 75d are shown. Although the channel layer 74 is not shown, it is located on a diagonally shaded region of the p-type silicon carbide layer 72. As shown in FIG. 12, in a lateral MOSFET, carriers travel in the direction from the source region 75s toward the drain region 75d. Elements are arranged such that this direction becomes substantially parallel to the miscut direction A.

In many lateral elements, current flowing therethrough is unidirectional. In some lateral elements, however, current flows in two or more directions. In this case, elements are arranged such that the dominating current flows in the direction parallel to the miscut direction A of the substrate. More particularly, elements are arranged such that one W1 of the widths of the channel region across which current flows through the channel region along the direction A becomes equal to or larger than the other width or widths thereof. In other words, elements are arranged such that the respective opposed edges of the source region 75s and the drain region 75d (the respective edges thereof coming into contact with the channel layer 74) become perpendicular to the miscut direction A.

The method described in this embodiment can be applied to not only the case where a δ-doped layer is used as the channel layer but also the case where the channel layer is a usual n-type dopant layer.

Furthermore, the method described in this embodiment can be applied to a lateral inversion-type MOSFET. FIG. 13 is a cross-sectional view showing the configuration of lateral inversion-type MOSFETs. In FIG. 13, unlike FIG. 11(b), a channel layer 74 (shown in FIG. 11(b)) is not formed. The other structure of each MOSFET is the same as that in FIG. 11(b), and thus a description thereof is not given.

Other Embodiments

In the previously-described embodiments, a substrate having a surface miscut by approximately 8 degrees from 4H—SiC is used as a semiconductor substrate. However, in the present invention, any other substrate may be used as long as it has a surface inclined at an angle of 10 degrees or less from the designated crystal plane S in a predetermined direction A.

In the present invention, for example, a silicon carbide layer heteroepitaxially grown on a miscut Si substrate may be used.

In the previously-described embodiments, a 4H—SiC silicon carbide layer is used. However, in the present invention, a silicon carbide layer of any other polytype crystal structure may be used as long as the polytype crystal structure has characteristics that make the electron mobility larger in the direction perpendicular to the crystal plane than in in-plane directions of the crystal plane.

If a miscut substrate, in spite of a polytype crystal structure having characteristics that make the electron mobility smaller in the direction perpendicular to the crystal plane than in in-plane directions of the crystal plane has a possibility that the electron mobility becomes larger in the miscut direction than in the direction perpendicular to the miscut direction, this miscut substrate may be used.

In the previously-described embodiments, a semiconductor substrate miscut in the <11-20> direction is used as a 4H—SiC(0001) substrate. However, in the present invention, a substrate miscut in the <11-20> direction or the <1-100> direction may be used as a semiconductor substrate. In this case, when a silicon carbide layer is epitaxially grown on the semiconductor substrate, the top surface of the silicon carbide layer is a plane miscut from the (0001) plane in the <11-20> direction or the <1-100> direction. However, as long as a desired plane comes to the top surface of the silicon carbide layer, the plane orientation and miscut direction of the semiconductor substrate located below the silicon carbide layer are not particularly restrictive. In other words, as long as the longest of the edges of the source region are configured to extend along the direction perpendicular to the miscut direction, the miscut direction may be any other direction than the previously-mentioned miscut direction.

The (0001) plane of silicon carbide typically represents a silicon plane. However, a carbon plane represented as a (000-1) plane may be used instead of the (0001) plane.

Such a state that the electron mobility through silicon carbide becomes larger in the miscut direction than in the other directions can be achieved when the interface state density at the interface between a channel region of a MOSFET and a gate insulating film thereof is $5\times10^{12}$ $cm^{-2}\cdot eV^{-1}$ or less at an energy level that is 0.1 eV smaller than the energy level of the conduction band of silicon carbide. It is preferable that the interface state density at the above-described interface is $1\times10^{12}$ $cm^{-2}\cdot eV^{-1}$ or less. On the contrary, when the interface state density is larger than $5\times10^{12}$ $cm^{-2}\cdot eV^{-1}$, the influence of step-bunching produced at the above-described interface makes the electron mobility smaller in the miscut direction (perpendicular to the step-bunching) than in the direction parallel to the step-bunching like known silicon carbide semiconductor devices.

In the previously-described embodiments, in order to reduce the interface state density at the interface between the silicon carbide layer and the gate insulating film, heat treatment is performed in an atmosphere containing nitric oxide (NO) after the formation of the gate insulating film. However, in the present invention, the same effect can be obtained by heat treatment in an atmosphere containing a group-V element. If the interface state density can be reduced, heat treatment may be performed in any other atmosphere or any other processing method may be used.

In the previously-described embodiments, nickel or aluminum is used as an electrode material. However, in the present invention, the electrode material is not limited to these materials, and an electrode may have a multilayer structure.

In the fabrication method for a silicon carbide semiconductor device of the present invention, any method except for the fabrication method described in the embodiments may be used. Unless otherwise designated, conditions and gas types are not limited to those for the process described herein. The silicon carbide semiconductor device may be fabricated on any other conditions.

As a matter of course, the silicon carbide semiconductor device of the present invention can have various modifications as long as the modifications have the same principal structure within the scope of the invention.

INDUSTRIAL APPLICABILITY

The semiconductor device of the present invention has a high industrial applicability in that the electron mobility through a silicon carbide layer, which has been reduced due to step-bunching or the other unfavorable interface state, is improved, thereby achieving excellent electrical characteristics.

The invention claimed is:

1. A semiconductor device comprising:
   a semiconductor substrate;
   a silicon carbide layer formed on the semiconductor substrate and having its top surface inclined at an angle of 10 degrees or less from a crystal plane in a miscut direction;
   a gate insulating film formed on the silicon carbide layer;
   a gate electrode formed on the gate insulating film;
   a source electrode formed on a part of the silicon carbide layer located to a side of the gate electrode;
   a drain electrode formed on the back surface of the semiconductor substrate; and
   a source region formed in a region of the silicon carbide layer located at least under the source electrode,
   wherein the longest of the edges of the source region extends along the direction perpendicular to the miscut direction in a plan view, and the semiconductor device contains a V-group element at the interface between the silicon carbide layer and the gate insulting film.

2. The semiconductor device of claim 1, further comprising:
   a well region of a second conductivity type formed in a part of the silicon carbide layer located on a lateral side of the source region and under the source region; and
   a base electrode electrically connected to the well region.

3. The semiconductor device of claim 1, wherein
   a direction extending along the direction perpendicular to the miscut direction is a direction at an inclination of 5 degrees or less from the direction perpendicular to the miscut direction.

4. The semiconductor device of claim 1, wherein
   a channel layer is formed in a region of the silicon carbide layer located under the gate insulating film.

5. The semiconductor device of claim 4, wherein
   the channel region has a multilayer structure including a first silicon carbide layer of at least one layer and a second silicon carbide layer of at least one layer having a higher first-conductivity-type dopant concentration and a smaller thickness than the first silicon carbide layer.

6. The semiconductor device of claim 1, wherein
   the electron mobility through the silicon carbide layer is larger in the direction perpendicular to the crystal plane than in in-plane directions of the crystal plane.

7. The semiconductor device of claim 1, wherein
   the silicon carbide layer is 4H—SiC.

8. The semiconductor device of claim 1, wherein
   the top surface of the silicon carbide layer is a plane inclined from the (0001) plane in the <11-20> direction.

9. The semiconductor device of claim 1, wherein
   the top surface of the silicon carbide layer is a plane inclined from the (0001) plane in the <1-100> direction.

10. The semiconductor device of claim 1, wherein
    the gate insulating film is formed by thermally oxidizing the upper part of the silicon carbide layer and subjecting the resultant upper part thereof to heat treatment in an atmosphere containing a compound inclusive of a group-V element.

11. The semiconductor device of claim 10, wherein
    the compound inclusive of the group-V element is nitric oxide.

12. The semiconductor device of claim 10, wherein
    a maximum nitrogen concentration is $1\times10^{20}$ $cm^{-3}$ through $1\times1022$ $cm^{-3}$ both inclusive at the interface between the silicon carbide layer and the gate insulating film.

13. The semiconductor device of claim 1, wherein
    the source electrode is formed using the same conductive film as the base electrode.

14. The semiconductor device of claim 1, wherein
    the gate electrode is formed to have a shape in which polygons are hollowed out in a plan view, and
    the longest of the edges of the hollowed polygons extend along the direction perpendicular to the miscut direction.

15. The semiconductor device of claim 14, wherein
    the source electrode is formed in the shape of polygons in a plan view, and
    the gate electrode is formed so as to be located apart from the source electrode and surround the lateral sides of the source electrode.

16. The semiconductor device of claim 1, wherein
the gate electrode is formed in the shape of a polygon in a plan view, and
the longest of the edges of the polygon extends along the direction perpendicular to the miscut direction.

17. The semiconductor device of claim 16, wherein
in a plan view, the source electrode is formed to have a comb shape including a plurality of first rectangular parts arranged in stripes and a first connection part through which the respective one ends of the plurality of first rectangular parts are connected to one another, and the gate electrode is formed to have a comb shape including a plurality of striped second rectangular parts arranged alternately with the plurality of first rectangular parts and a second connection part through which the respective one ends of the plurality of second rectangular parts are connected to one another.

* * * * *

UNITED STATES PATENT AND TRADEMARK OFFICE
CERTIFICATE OF CORRECTION

PATENT NO.         : 7,214,984 B2
APPLICATION NO. : 10/553628
DATED               : May 8, 2007
INVENTOR(S)        : Masao Uchida et al.

Page 1 of 1

It is certified that error appears in the above-identified patent and that said Letters Patent is hereby corrected as shown below:

Column 18, line 50, change "$1 \times 1022 \text{ cm}^{-3}$" to -- $1 \times 10^{22} \text{cm}^{-3}$ --

Signed and Sealed this

Fourth Day of December, 2007

JON W. DUDAS
*Director of the United States Patent and Trademark Office*